(12) United States Patent
Liao et al.

(10) Patent No.: US 11,890,564 B2
(45) Date of Patent: Feb. 6, 2024

(54) TOOL-LESS AIR FILTER ATTACHING MECHANISM FOR PLANNING AND CONTROL SYSTEM OF AUTONOMOUS DRIVING VEHICLES

(71) Applicant: Baidu USA LLC, Sunnyvale, CA (US)

(72) Inventors: Fu-Kang Liao, Sunnyvale, CA (US); Wendy Lu, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 342 days.

(21) Appl. No.: 16/203,588

(22) Filed: Nov. 28, 2018

(65) Prior Publication Data
US 2020/0164297 A1 May 28, 2020

(51) Int. Cl.
*B01D 46/00* (2022.01)
*B60W 30/10* (2006.01)
*B01D 46/10* (2006.01)

(52) U.S. Cl.
CPC ..... *B01D 46/0005* (2013.01); *B01D 46/0004* (2013.01); *B01D 46/10* (2013.01); *B60W 30/10* (2013.01); *B01D 2265/023* (2013.01); *B01D 2279/45* (2013.01)

(58) Field of Classification Search
None
See application file for complete search history.

(56) References Cited

U.S. PATENT DOCUMENTS

| | | | | |
|---|---|---|---|---|
| 3,215,616 A | * | 11/1965 | Spielman | C01B 13/115 422/186.07 |
| 3,912,473 A | * | 10/1975 | Wilkins | B01D 46/10 55/501 |
| 4,470,834 A | * | 9/1984 | Fasanaro | B01D 46/10 55/501 |
| 5,168,171 A | * | 12/1992 | Tracewell | H05K 7/207 307/64 |
| 5,525,145 A | * | 6/1996 | Hodge | B01D 46/001 96/17 |
| 6,072,119 A | * | 6/2000 | Nicolai | B01D 46/0032 174/386 |
| 6,174,340 B1 | * | 1/2001 | Hodge | B01D 46/10 55/385.1 |

(Continued)

FOREIGN PATENT DOCUMENTS

EP 3062033 A1 * 8/2016 ............. F24F 13/28

*Primary Examiner* — Brit E. Anbacht
(74) *Attorney, Agent, or Firm* — WOMBLE BOND DICKINSON (US) LLP (57) ABSTRACT

A perception and planning system includes a system frame and one or more cooling fans mounted on a first side of the system frame to generate an airflow flowing outwardly to remove at least a portion of the heat generated by the processors. The system further includes an air filtering module mounted on a second side of the system frame to filter the air flow flowing inwardly to remove durst or contaminated material from the airflow. The air filtering module includes an air filter, a mounting plate, and a cover plate. The mounting plate can be mounted on the second side of the system frame to receive the air filter. The mounting plate includes one or more magnets. The cover plate can be attached to the mounting plate by a magnetic force generated from the magnets to keep the air filter between the mounting plate and the cover plate.

20 Claims, 8 Drawing Sheets

(56) References Cited

U.S. PATENT DOCUMENTS

| | | | |
|---|---|---|---|
| 8,432,685 B2* | 4/2013 | Huang | H05K 5/0213 165/104.33 |
| 2004/0020363 A1* | 2/2004 | LaFerriere | B01D 46/0028 55/472 |
| 2004/0081596 A1* | 4/2004 | Hsi | B01D 53/86 422/186.3 |
| 2005/0013711 A1* | 1/2005 | Goyetche | B01D 46/10 417/423.9 |
| 2007/0245701 A1* | 10/2007 | Su | B01D 46/42 55/490 |
| 2008/0115473 A1* | 5/2008 | Miller | B01D 46/10 55/385.6 |
| 2009/0021910 A1* | 1/2009 | Lai | H05K 7/20181 361/695 |
| 2009/0199526 A1* | 8/2009 | Wallace | B01D 46/10 55/493 |
| 2010/0101197 A1* | 4/2010 | Livingstone | B01D 46/0006 55/356 |
| 2013/0340400 A1* | 12/2013 | Minaeeghainipour | B01D 46/0002 55/511 |
| 2014/0150658 A1* | 6/2014 | Prax | B01D 46/0036 96/74 |
| 2016/0105996 A1* | 4/2016 | Schanzenbach | F04D 29/703 415/121.2 |
| 2016/0151729 A1* | 6/2016 | Cammi | B01D 39/1623 96/135 |
| 2017/0007951 A1* | 1/2017 | DeChristofaro | B01D 46/10 |
| 2017/0128871 A1* | 5/2017 | Schumacher | B01D 46/10 |
| 2017/0204783 A1* | 7/2017 | Du | H02K 7/1815 |
| 2018/0202465 A1* | 7/2018 | Randall | F04D 29/703 |
| 2019/0006915 A1* | 1/2019 | Lapelosa | B01D 46/10 |
| 2019/0282943 A1* | 9/2019 | Duncan | B01D 46/10 |
| 2019/0323725 A1* | 10/2019 | Regnier | B01D 46/0036 |
| 2020/0101408 A1* | 4/2020 | Brown | B01D 46/0005 |

* cited by examiner

TOOL-LESS AIR FILTER ATTACHING MECHANISM FOR PLANNING AND CONTROL SYSTEM OF AUTONOMOUS DRIVING VEHICLES

TECHNICAL FIELD

Embodiments of the present disclosure relate generally to operating autonomous vehicles. More particularly, embodiments of the disclosure relate to an air filter mounting mechanism for attaching an air filter to a planning and control system of an autonomous driving vehicle.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

High performance computation devices for high level autonomous driving require active cooling, either with fans, liquid, or both. For those with fans, air filters are required in order to block dust and other containments from entering the system. Typically air filter subassembly is attached to the system using screws or similar fasteners. However, such a configuration incurs a higher cost as most screws and inserts are required, it requires more manufacturing processes. In addition, the process of replacing an air filter is more complicated. A user has to unscrew the air filter subassembly. An alternative way to attach an air filter is to use adhesive, which is a one-time usage that makes replacement of an air filter infeasible.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Accordingly, an easier air filter attachment mechanism is utilized to attach an air filter to a data processing system, such as a perception and planning system of an autonomous driving vehicle (ADV), without having to use attaching tools such as screws or nuts, etc. As a result, the replacement of an air filter is simpler and quicker.

According to one embodiment, a perception and planning system of an autonomous driving vehicle (ADV) includes a system frame to house one or more processors therein. The processors can execute instructions to perceive a driving environment surrounding the ADV, to plan a trajectory based on the perceived driving environment, and to control the ADV according to the trajectory. The system further includes one or more cooling fans mounted on a first side of the system frame to generate an airflow flowing outwardly to remove at least a portion of the heat generated by the processors. The system further includes an air filtering module mounted on a second side of the system frame to filter the air flow flowing inwardly to remove durst or contaminated material from the airflow. The air filtering module includes an air filter, a mounting plate, and a cover plate. The mounting plate can be mounted on the second side of the system frame to receive the air filter deposited thereon. The mounting plate includes one or more magnets disposed thereon.

In one embodiment, the cover plate, which is made of metal material, can be attached to the mounting plate by a magnetic force generated from the magnets to retain the air filter between the mounting plate and the cover plate. The cover plate is attracted to the mounting plate due to the magnetic force without having to use a mounting screw to attach the same onto the mounting plate. The magnetic force is strong enough to attach the cover plate to the mounting plate without using a mounting screw to retain the cover plate from laterally moving during driving of the ADV. On the other hand, the magnetic force is weak enough to allow a user to remove or detach the cover plate from the mounting plate without using a tool for the purpose of replacing the air filter.

In one embodiment, the mounting plate is an open frame to allow the air flow to flow through the air filter into airspace of the system frame. The mounting plate further includes one or more cross bars across the opening of the open frame to prevent the air filter from falling through the open frame. The mounting plate further includes one or more edges molded in an L-shape to form a container well to allow the air filter to be deposited therein. The L-shape edges of the mounting frame prevent the air filter from laterally moving. The L-shape edges are formed to have a thickness or height according to the thickness of the air filter. The magnets include a first set of magnets disposed on a first edge of the mounting plate and a second set of magnets disposed on a second edge of the mounting plate. The first edge and the second edge are opposite edges of the mounting plate. The mounting plate can be attached to the system frame using one or more screws. When replacing the air filter, a user just simply removes the cover plate by pulling the cover plate away from the magnets without having to remove the mounting plate. Note that throughout this application, the air filtering mechanism is utilized in a perception and planning system of an ADV. However, the mechanism can also be applicable to other data processing systems.

Figure 1:
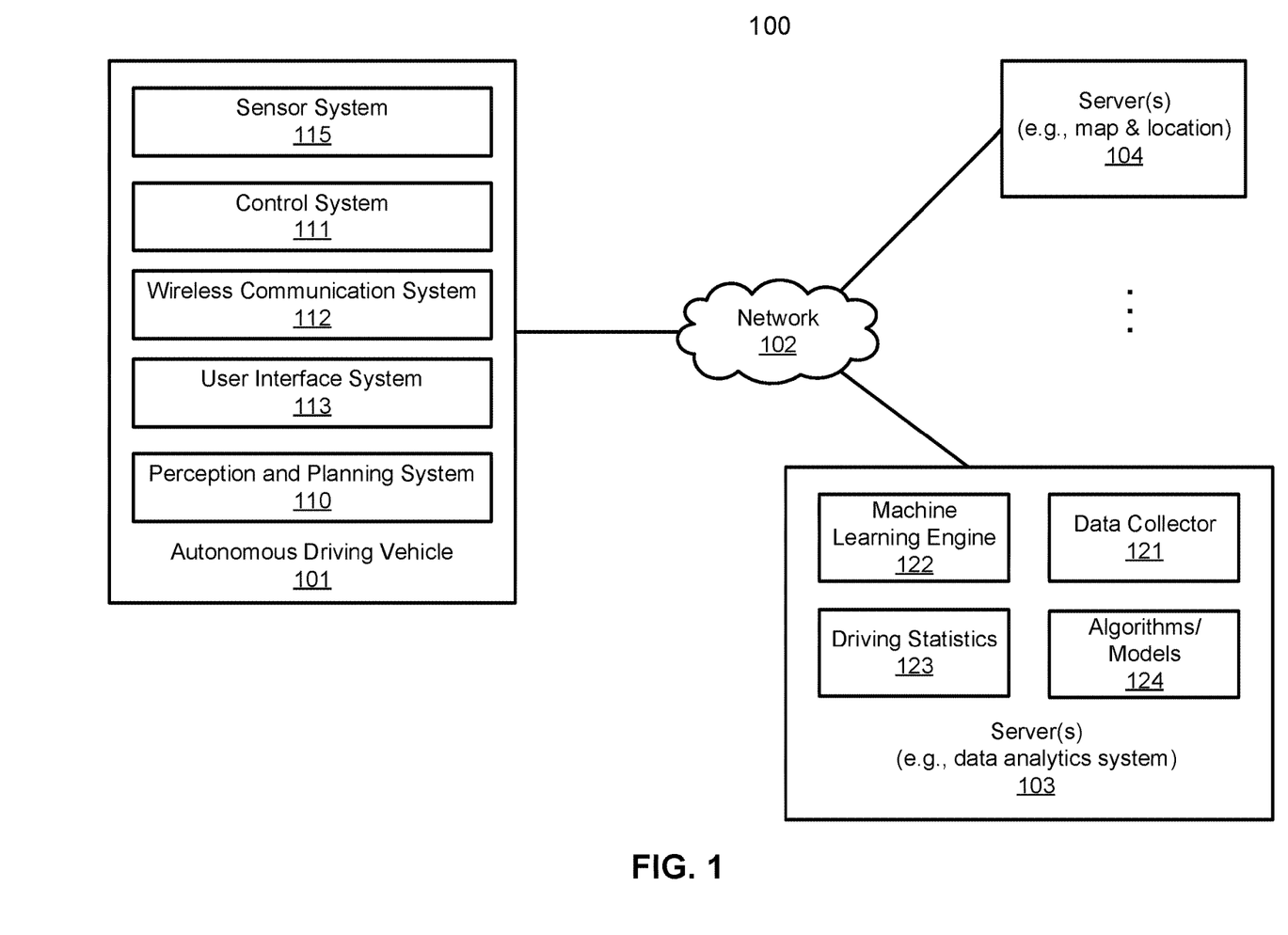
FIG. 1 is a block diagram illustrating a networked system according to one embodiment.

FIG. 1 is a block diagram illustrating an autonomous vehicle network configuration according to one embodiment of the disclosure. Referring to FIG. 1, network configuration 100 includes autonomous vehicle 101 that may be communicatively coupled to one or more servers 103-104 over a network 102. Although there is one autonomous vehicle shown, multiple autonomous vehicles can be coupled to each other and/or coupled to servers 103-104 over network 102. Network 102 may be any type of networks such as a local area network (LAN), a wide area network (WAN) such as the Internet, a cellular network, a satellite network, or a combination thereof, wired or wireless. Server(s) 103-104 may be any kind of servers or a cluster of servers, such as Web or cloud servers, application servers, backend servers, or a combination thereof. Servers 103-104 may be data analytics servers, content servers, traffic information servers, map and point of interest (MPOI) servers, or location servers, etc.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. Autonomous vehicle 101 can operate in a manual mode, a full autonomous mode, or a partial autonomous mode.

In one embodiment, autonomous vehicle 101 includes, but is not limited to, perception and planning system 110, vehicle control system 111, wireless communication system 112, user interface system 113, infotainment system 114, and sensor system 115. Autonomous vehicle 101 may further include certain common components included in ordinary vehicles, such as, an engine, wheels, steering wheel, transmission, etc., which may be controlled by vehicle control system 111 and/or perception and planning system 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, or a combination thereof. For example, components 110-115 may be communicatively coupled to each other via a controller area network (CAN) bus. A CAN bus is a vehicle bus standard designed to allow microcontrollers and devices to communicate with each other in applications without a host computer. It is a message-based protocol, designed originally for multiplex electrical wiring within automobiles, but is also used in many other contexts.

Figure 2:
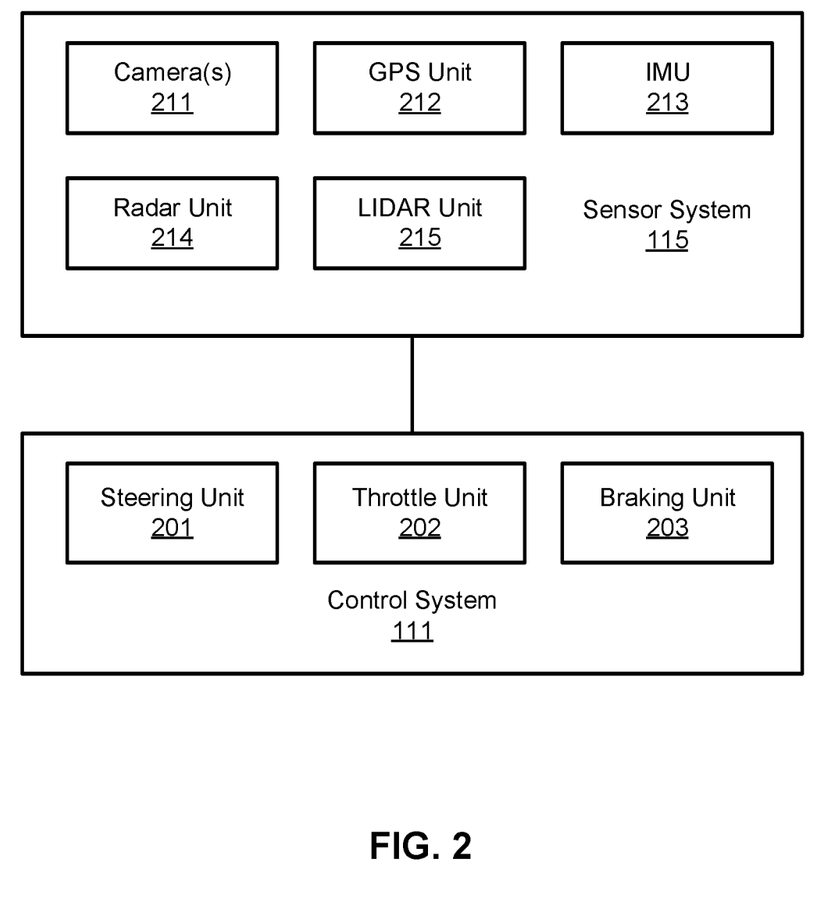
FIG. 2 is a block diagram illustrating an example of an autonomous vehicle according to one embodiment.

Referring now to FIG. 2, in one embodiment, sensor system 115 includes, but it is not limited to, one or more cameras 211, global positioning system (GPS) unit 212, inertial measurement unit (IMU) 213, radar unit 214, and a light detection and range (LIDAR) unit 215. GPS system 212 may include a transceiver operable to provide information regarding the position of the autonomous vehicle. IMU unit 213 may sense position and orientation changes of the autonomous vehicle based on inertial acceleration. Radar unit 214 may represent a system that utilizes radio signals to sense objects within the local environment of the autonomous vehicle. In some embodiments, in addition to sensing objects, radar unit 214 may additionally sense the speed and/or heading of the objects. LIDAR unit 215 may sense objects in the environment in which the autonomous vehicle is located using lasers. LIDAR unit 215 could include one or more laser sources, a laser scanner, and one or more detectors, among other system components. Cameras 211 may include one or more devices to capture images of the environment surrounding the autonomous vehicle. Cameras 211 may be still cameras and/or video cameras. A camera may be mechanically movable, for example, by mounting the camera on a rotating and/or tilting a platform.

Sensor system 115 may further include other sensors, such as, a sonar sensor, an infrared sensor, a steering sensor, a throttle sensor, a braking sensor, and an audio sensor (e.g., microphone). An audio sensor may be configured to capture sound from the environment surrounding the autonomous vehicle. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor.

In one embodiment, vehicle control system 111 includes, but is not limited to, steering unit 201, throttle unit 202 (also referred to as an acceleration unit), and braking unit 203. Steering unit 201 is to adjust the direction or heading of the vehicle. Throttle unit 202 is to control the speed of the motor or engine that in turn control the speed and acceleration of the vehicle. Braking unit 203 is to decelerate the vehicle by providing friction to slow the wheels or tires of the vehicle. Note that the components as shown in FIG. 2 may be implemented in hardware, software, or a combination thereof.

Referring back to FIG. 1, wireless communication system 112 is to allow communication between autonomous vehicle 101 and external systems, such as devices, sensors, other vehicles, etc. For example, wireless communication system 112 can wirelessly communicate with one or more devices directly or via a communication network, such as servers 103-104 over network 102. Wireless communication system 112 can use any cellular communication network or a wireless local area network (WLAN), e.g., using WiFi to communicate with another component or system. Wireless communication system 112 could communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of autonomous vehicle 101 may be controlled or managed by perception and planning system 110, especially when operating in an autonomous driving mode. Perception and planning system 110 includes the necessary hardware (e.g., processor(s), memory, storage) and software (e.g., operating system, planning and routing programs) to receive information from sensor system 115, control system 111, wireless communication system 112, and/or user interface system 113, process the received information, plan a route or path from a starting point to a destination point, and then drive vehicle 101 based on the planning and control information. Alternatively, perception and planning system 110 may be integrated with vehicle control system 111.

For example, a user as a passenger may specify a starting location and a destination of a trip, for example, via a user interface. Perception and planning system 110 obtains the trip related data. For example, perception and planning system 110 may obtain location and route information from an MPOI server, which may be a part of servers 103-104. The location server provides location services and the MPOI server provides map services and the POIs of certain locations. Alternatively, such location and MPOI information may be cached locally in a persistent storage device of perception and planning system 110.

While autonomous vehicle 101 is moving along the route, perception and planning system 110 may also obtain real-time traffic information from a traffic information system or server (TIS). Note that servers 103-104 may be operated by a third party entity. Alternatively, the functionalities of servers 103-104 may be integrated with perception and planning system 110. Based on the real-time traffic information, MPOI information, and location information, as well as real-time local environment data detected or sensed by sensor system 115 (e.g., obstacles, objects, nearby vehicles), perception and planning system 110 can plan an optimal route and drive vehicle 101, for example, via control system 111, according to the planned route to reach the specified destination safely and efficiently.

Server 103 may be a data analytics system to perform data analytics services for a variety of clients. In one embodiment, data analytics system 103 includes data collector 121 and machine learning engine 122. Data collector 121 collects driving statistics 123 from a variety of vehicles, either autonomous vehicles or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

Based on driving statistics 123, machine learning engine 122 generates or trains a set of rules, algorithms, and/or predictive models 124 for a variety of purposes. In one embodiment, algorithms 124 may include algorithms to perceive a driving environment, to plan a path, and to control an ADV according to path. Algorithms 124 can then be uploaded on ADVs to be utilized during autonomous driving in real-time.

Figure 3:
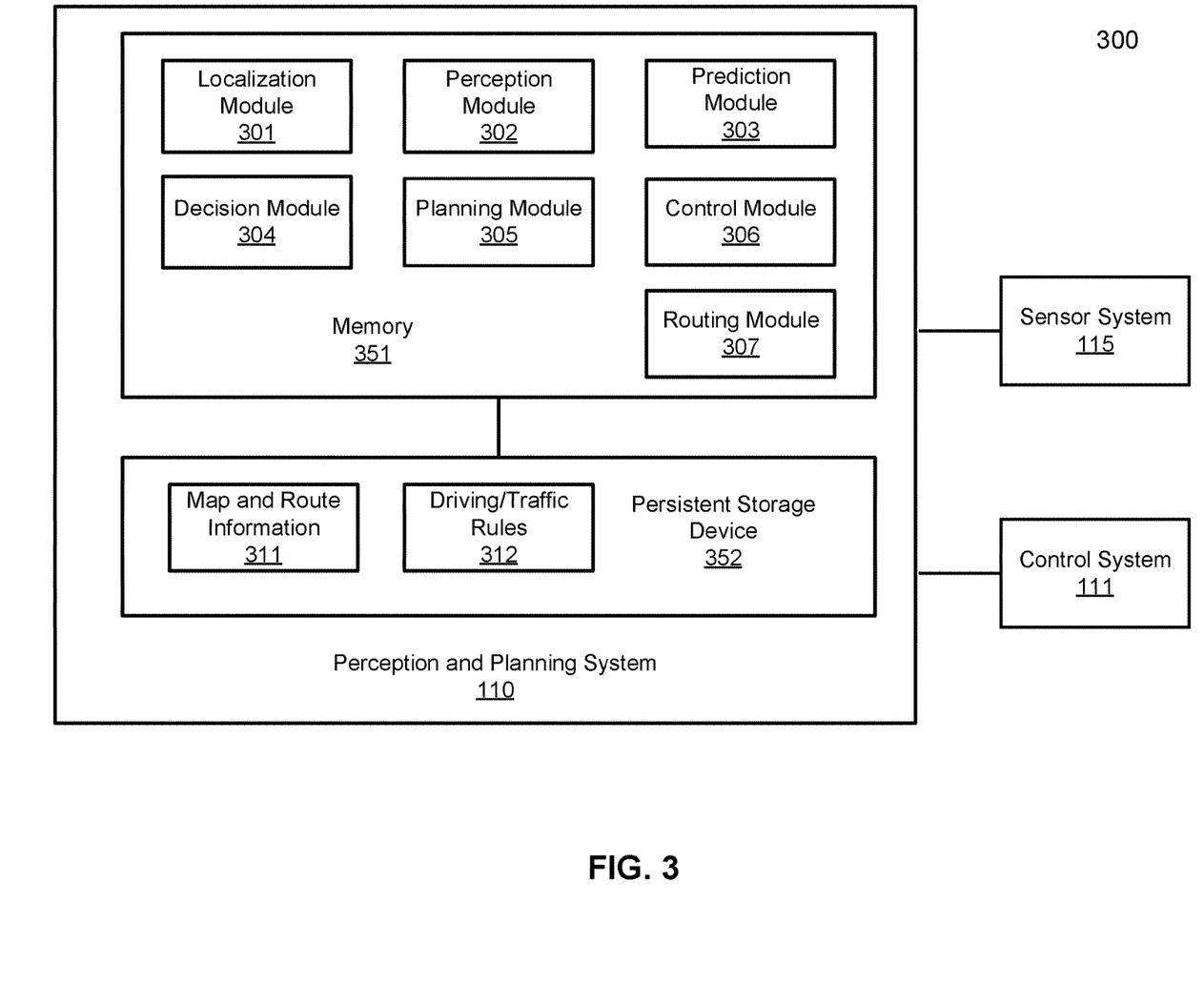
FIG. 3 is a block diagram illustrating an example of a perception and planning system used with an autonomous vehicle according to one embodiment.

FIG. 3 is a block diagram illustrating an example of a perception and planning system used with an autonomous vehicle according to one embodiment. System 300 may be implemented as a part of autonomous vehicle 101 of FIG. 1 including, but is not limited to, perception and planning system 110, control system 111, and sensor system 115. Referring to FIG. 3, perception and planning system 110 includes, but is not limited to, localization module 301, perception module 302, prediction module 303, decision module 304, planning module 305, control module 306, and routing module 307.

Some or all of modules 301-307 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-307 may be integrated together as an integrated module.

Localization module 301 determines a current location of autonomous vehicle 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of autonomous vehicle 300, such as map and route information 311, to obtain the trip related data. For example, localization module 301 may obtain location and route information from a location server and a map and POI (MPOI) server. A location server provides location services and an MPOI server provides map services and the POIs of certain locations, which may be cached as part of map and route information 311. While autonomous vehicle 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception can include the lane configuration, traffic light signals, a relative position of another vehicle, a pedestrian, a building, crosswalk, or other traffic related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras in order to identify objects and/or features in the environment of autonomous vehicle. The objects can include traffic signals, road way boundaries, other vehicles, pedestrians, and/or obstacles, etc. The computer vision system may use an object recognition algorithm, video tracking, and other computer vision techniques. In some embodiments, the computer vision system can map an environment, track objects, and estimate the speed of objects, etc. Perception module 302 can also detect objects based on other sensors data provided by other sensors such as a radar and/or LIDAR.

For each of the objects, prediction module 303 predicts what the object will behave under the circumstances. The prediction is performed based on the perception data perceiving the driving environment at the point in time in view of a set of map/rout information 311 and traffic rules 312. For example, if the object is a vehicle at an opposing direction and the current driving environment includes an intersection, prediction module 303 will predict whether the vehicle will likely move straight forward or make a turn. If the perception data indicates that the intersection has no traffic light, prediction module 303 may predict that the vehicle may have to fully stop prior to enter the intersection. If the perception data indicates that the vehicle is currently at a left-turn only lane or a right-turn only lane, prediction module 303 may predict that the vehicle will more likely make a left turn or right turn respectively.

For each of the objects, decision module 304 makes a decision regarding how to handle the object. For example, for a particular object (e.g., another vehicle in a crossing route) as well as its metadata describing the object (e.g., a speed, direction, turning angle), decision module 304 decides how to encounter the object (e.g., overtake, yield, stop, pass). Decision module 304 may make such decisions according to a set of rules such as traffic rules or driving rules 312, which may be stored in persistent storage device 352.

Routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in a form of a topographic map for each of the routes it determines from the starting location to reach the destination location. A reference line refers to an ideal route or path without any interference from others such as other vehicles, obstacles, or traffic condition. That is, if there is no other vehicle, pedestrians, or obstacles on the road, an ADV should exactly or closely follows the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 dependent upon the specific driving environment at the point in time.

Based on a decision for each of the objects perceived, planning module 305 plans a path or route for the autonomous vehicle, as well as driving parameters (e.g., distance, speed, and/or turning angle), using a reference line provided by routing module 307 as a basis. That is, for a given object, decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 mile per hour (mph), then change to a right lane at the speed of 25 mph.

Based on the planning and control data, control module 306 controls and drives the autonomous vehicle, by sending proper commands or signals to vehicle control system 111, according to a route or path defined by the planning and control data. The planning and control data include sufficient information to drive the vehicle from a first point to a second point of a route or path using appropriate vehicle settings or driving parameters (e.g., throttle, braking, steering commands) at different points in time along the path or route.

In one embodiment, the planning phase is performed in a number of planning cycles, also referred to as driving cycles, such as, for example, in every time interval of 100 milliseconds (ms). For each of the planning cycles or driving cycles, one or more control commands will be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one embodiment, planning module 305 plans a route segment or path segment for the next predetermined period of time such as 5 seconds. For each planning cycle, planning module 305 plans a target position for the current cycle (e.g., next 5 seconds) based on a target position planned in a previous cycle. Control module 306 then generates one or more control commands (e.g., throttle, brake, steering control commands) based on the planning and control data of the current cycle.

Note that decision module 304 and planning module 305 may be integrated as an integrated module. Decision module 304/planning module 305 may include a navigation system or functionalities of a navigation system to determine a driving path for the autonomous vehicle. For example, the navigation system may determine a series of speeds and directional headings to affect movement of the autonomous vehicle along a path that substantially avoids perceived obstacles while generally advancing the autonomous vehicle along a roadway-based path leading to an ultimate destination. The destination may be set according to user inputs via user interface system 113. The navigation system may update the driving path dynamically while the autonomous vehicle is in operation. The navigation system can incorporate data from a GPS system and one or more maps so as to determine the driving path for the autonomous vehicle.

Figure 4:
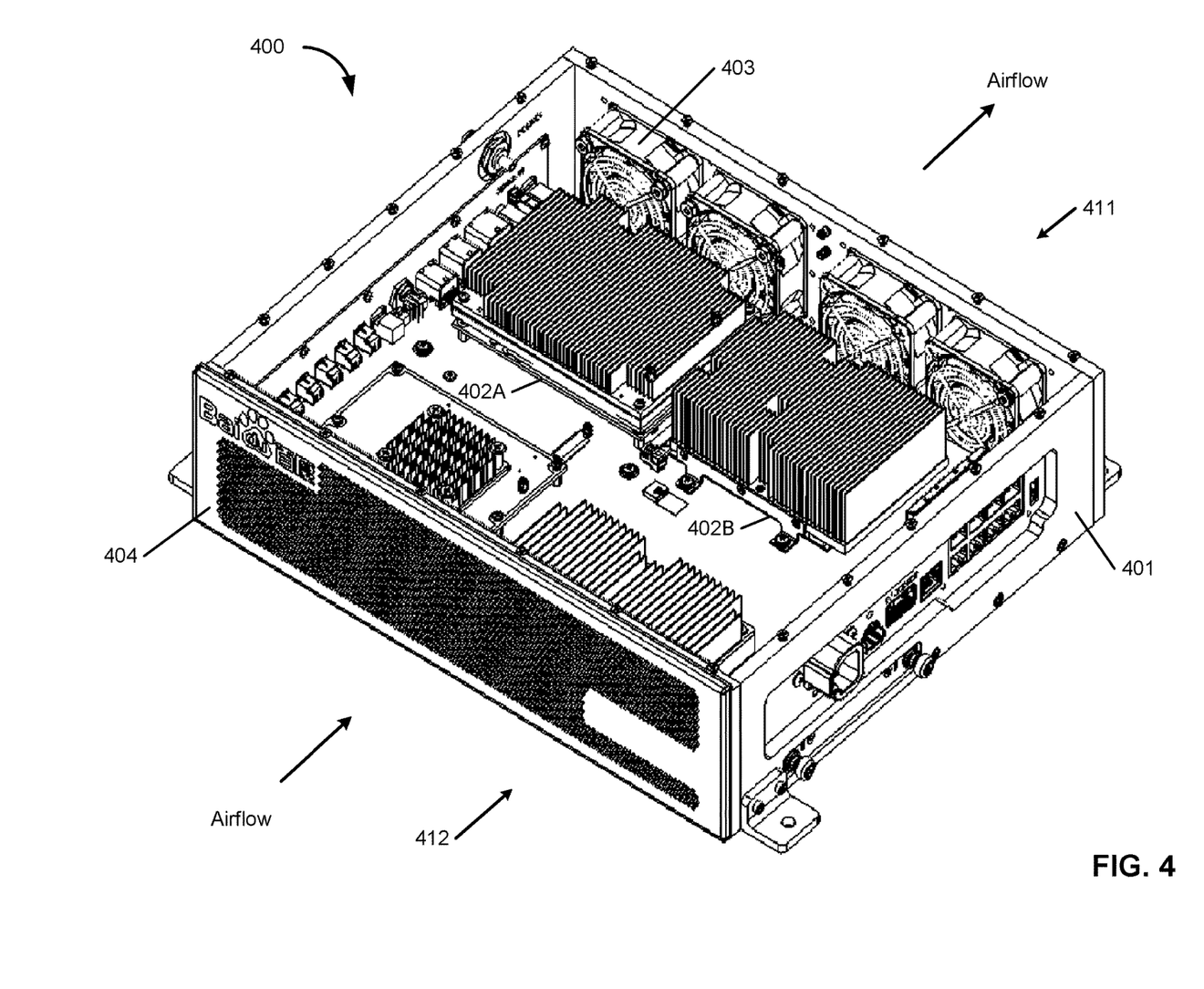
FIG. 4 shows a perspective view of a data processing system according to one embodiment.

FIG. 4 shows a perspective view of a data processing system according to one embodiment of the invention. System 400 may represent perception and planning system 110 as described above. Referring to FIG. 4, system 400 includes a system frame 401 to house a data processing system therein, including one or more processors, memories, and/or a storage device, etc. mounted on a printed circuit board (PCB) (also referred to as a motherboard). Some of these components may generate heat during the operations. For example, some of the processors, which may be implemented in a form of a microprocessor, co-processor, FPGA, ASIC, etc., may be attached to a heatsink such as heatsinks 402A-402B. A heatsink is adapted to receive the heat generated from the heat generating component underneath and to radiate the heat into the airspace within system frame 401.

In addition, one or more cooling fans, such as cooling fans 403, mounted on a first side 411 of system frame 401. The cooling fans are configured to generate an airflow outwardly to remove and exhaust heat generated from the heat generating components within the airspace of system frame 401. An air filtering module 404 is attached to a second side 412 of system frame 401. The filtering module 404 is configured to filter the airflow flowing inwardly to reduce or remove dust or other contaminated material from the airflow. The first side 411 and the second side 412 may be the opposite sides of system frame 401. The other sides of system frame 401 may be utilized to mount the interface modules to allow system 400 to be coupled to other components such as a sensor unit or a vehicle platform of an ADV.

Figure 5A:
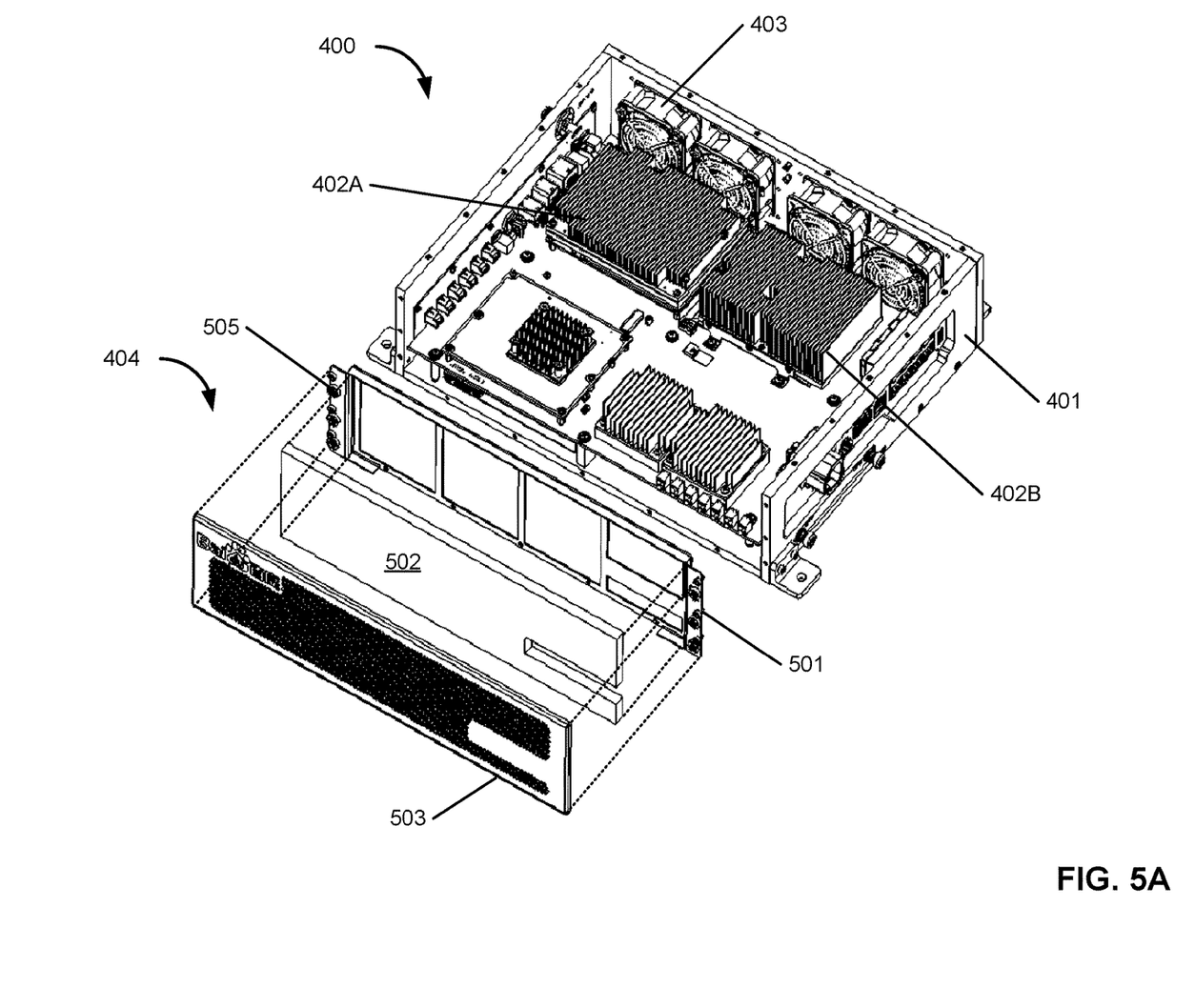
FIGS. 5A and 5B show a perspective view of a data processing system according to another embodiment.
Figure 5B:
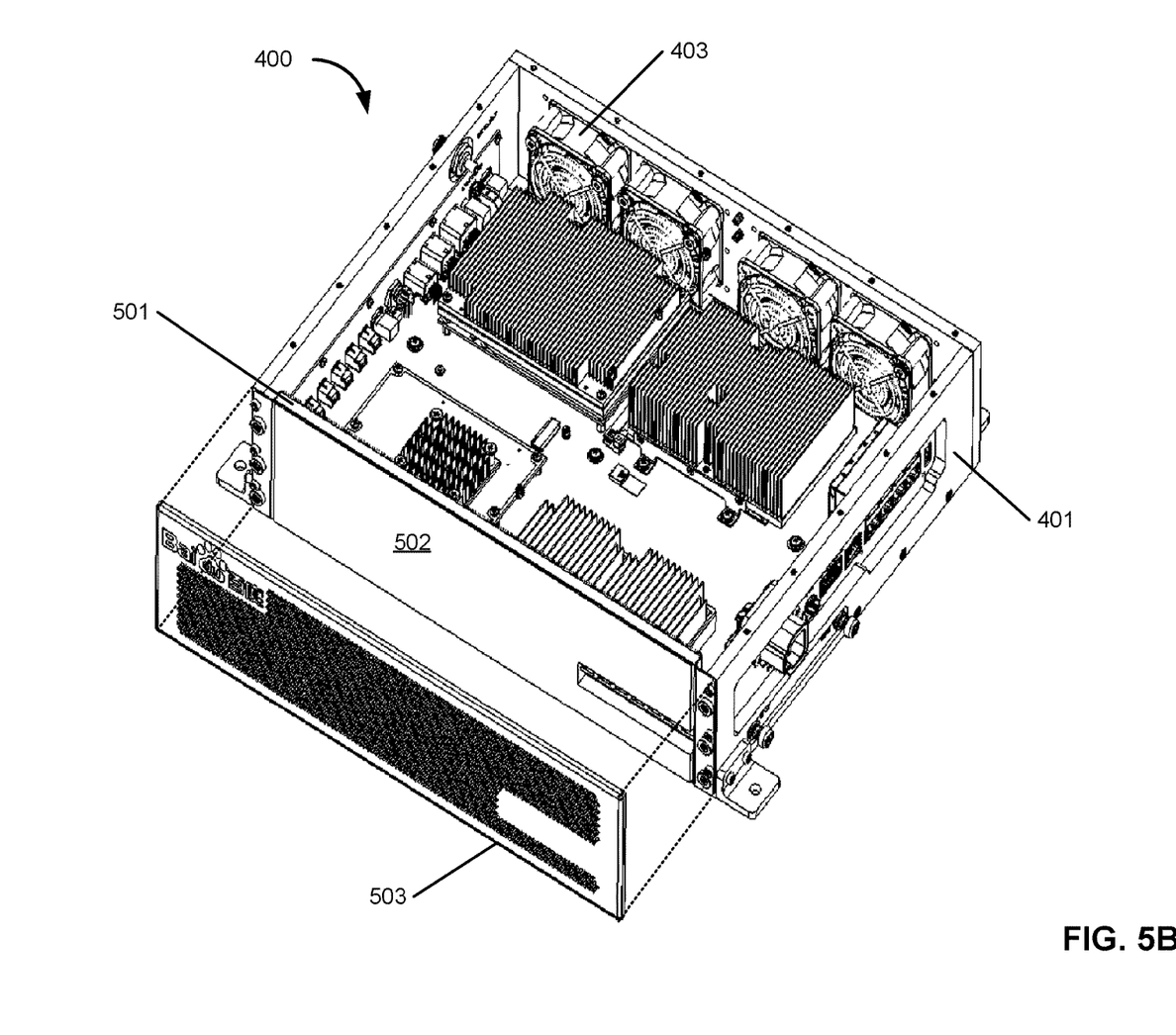

FIGS. 5A and 5B show another perspective view of a data processing system illustrating a mounting procedure of an air filter according to one embodiment. Referring to FIG. 5A, the second side 412 of system frame 401 can be covered by the filtering module 404. In one embodiment, filtering module 404 includes a mounting plate 501, an air filter 502, and a cover plate 503. Mounting plate 501 can be mounted onto system frame 401 using screws. One or more magnets such as magnet 505 are disposed on the edges of mounting plate 501. Once mounting plate 501 has been attached to system frame 401, air filter 502 can be placed onto the receiving well of mounting plate 501. Thereafter, cover plate 503, which may be made of metal, can be attracted and attached to mounting plate 501 due to the magnetic force generated between the magnets and metal cover plate 503 to prevent air filter 502 from falling off, as shown in FIG. 5B.

Figure 6A:
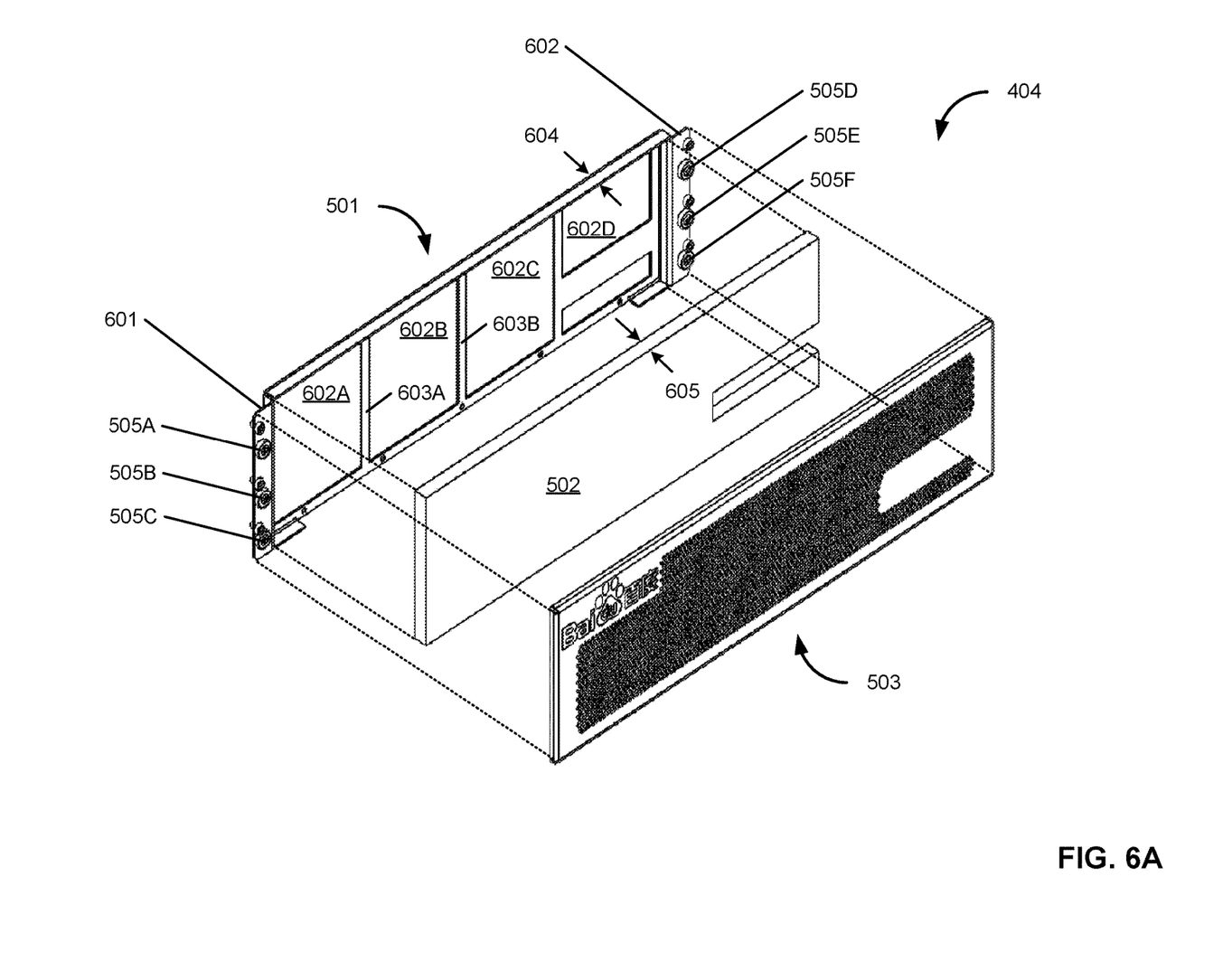
FIGS. 6A and 6B show an exploded view of an air filtering module according to one embodiment.
Figure 6B:
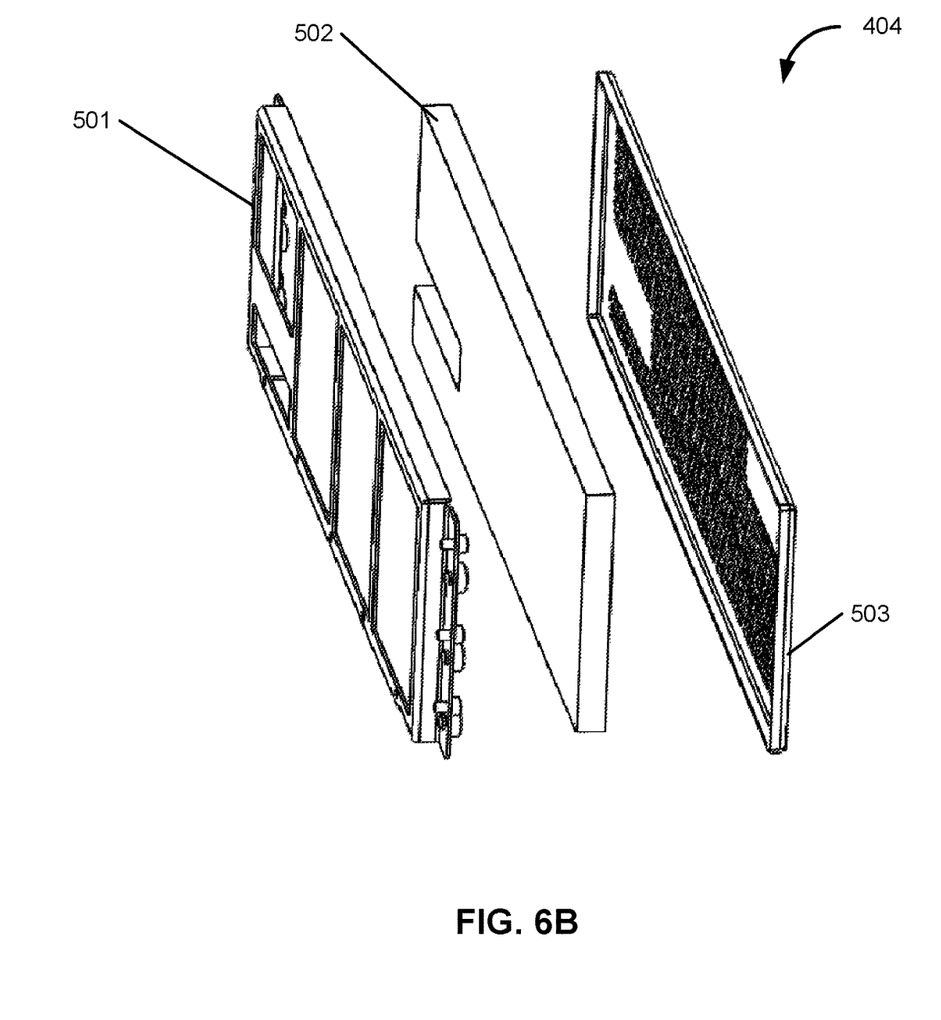

FIGS. 6A and 6B show an exploded view of an air filtering module according to one embodiment. Referring to FIGS. 6A and 6B, as described above, air filtering module 404 includes mounting plate 501, air filter 502, and cover plate 503. In one embodiment, mounting plate 501 is molded into a tray-like shape, where at least a portion of the edges is formed in an L-shape, i.e., raised edges. Such a tray-like form factor operates like a receiving well or container to receive air filter 503. However, mounting plate 501 is also formed as an open frame where there are several openings such as openings 602A-602D to allow an airflow flowing through.

In addition, one or more cross bars such as cross bars 603A-603B are disposed across the edges of mounting plate 501 to prevent air filter 503 from falling through. The size of the receiving well is similar to or a little bit larger than the size of air filter 503. The height of the raised edge 604 is similar to or a little bit taller than the thickness 605 of air filter 502, such that when air filter 502 is deposited onto the receiving well or receiving tray of mounting plate 501, air filter 502 can be laid flat compared to the raised edges of mounting plate 501. The receiving well or receiving tray of mounting plate 501 is configured to prevent air filter 502 from laterally moving.

In one embodiment, mounting plate 501 includes a first mounting edge 601 and a second mounting edge 602, which may be disposed on the opposite side of mounting plate 501. Each of the mounting edges 601 and 602 includes one or more mounting holes or mounting screws to allow mounting plate 501 to be mounted onto system frame 401. In addition, each of mounting edges 601-602 includes one or more magnets disposed thereon. For example, mounting edge 601 includes one or more magnets 505A-505C disposed thereon. Mounting edge 602 includes one or more magnets 505D-505F disposed thereon.

Cover plate 503 includes a number of holes or opening in a mesh to allow an airflow flowing through. Cover plate 503 may be made of metal that can be attracted to magnets 505A-505F (collectively referred to as magnets 505). After air filter 502 is deposited into the receiving well or receiving tray of mounting plate 501, cover plate 503 can be placed on top of air filter 502. Due to the magnetic force generated from magnets 505 and cover plate 503 is made of metal, cover plate 503 (also referred to as a cover sheet) is attracted to magnets 505 and attached to mounting plate 501, which prevents air filter 502 from falling out.

In one embodiment, the number of magnets 505 and/or the type or material of magnets 505 are selected such that the magnetic force generated between magnets 505 and cover plate 503 is strong enough, such that cover plate 503 is attracted and attached to mounting plate without falling off or moving, particularly during driving of a vehicle. However, the magnetic force is weak enough that a user can simply pull cover plate 503 off mounting plate 501 for cleaning and/or replacement of air filter 502 without having to use a tool such as a screw driver, etc.

Again, the air filtering mechanism described through this application is illustrated in view of a perception and planning system of an autonomous driving vehicle for the purpose of illustration. However, the techniques can also be applicable to any data processing system as a part of an air cooling system.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A perception and planning system for operating an autonomous driving vehicle, the system comprising:
    a system frame to house one or more processors therein, wherein the one or more processors execute computer instructions to perceive a driving environment surrounding the autonomous driving vehicle (ADV), to plan a traj ectory based on the perceived driving environment, and to control the ADV according to the trajectory;
    one or more cooling fans mounted on a first side of the system frame to generate an airflow flowing outwardly to remove at least a portion of heat generated by the one or more processors; and
    an air filtering module mounted on a second side of the system frame to filter the airflow flowing inwardly to remove dust or contaminated material from the airflow, wherein the air filtering module comprises
        an air filter, wherein the air filter is separate from a cover plate,
        a mounting plate mounted onto the second side of the system frame to receive the air filter deposited thereon, wherein the mounting plate is modeled into a tray-like shape formed in an L-shape operated like a receiving well and container to receive the air filter, wherein one or more cross bars are disposed across a first edge and a second edge on the opposite side of the mounting plate, wherein the first edges and the second edge include one or more mounting holes, wherein the size of the receiving well is larger than the size of air filter, wherein a bottom cross brace of the mounting plate includes one or more mounting holes, wherein the mounting plate includes one or more magnets disposed thereon, wherein the bottom cross brace is indented from the cross bars at the bottom of the receiving well, wherein the one or more magnets comprises a first set of one or more magnets disposed on the first edge of the mounting plate and a second set of one or more magnets disposed on the second edge of the mounting plate, wherein the cover plate is made of metal to attract the one or more magnets disposed on the mounting plate to prevent the air filter from falling out, and
        the cover plate attached to the mounting plate by a magnetic force generated from the magnets to keep the air filter between the mounting plate and the cover plate, wherein the mounting plate is mounted onto the system frame using one or more screws.

2. The system of claim 1, wherein the cover plate is attached to the mounting plate due to the magnetic force without having to use a mounting screw to attach the cover plate onto the mounting plate.

3. The system of claim 2, wherein the cover plate is detachable from the mounting plate for a user without using a tool for a purpose of replacing the air filter.

4. The system of claim 1, wherein the mounting plate is an open frame to allow the airflow to flow through the air filter into an airspace of the system frame.

5. The system of claim 4, wherein the mounting plate comprises the one or more cross bars across opening of the open frame to prevent the air filter from falling through the open frame.

6. The system of claim 4, wherein the mounting plate comprises one or more edges molded in an L-shape to form a container.

7. The system of claim 6, wherein the L-shape edges of the mounting plate prevent the air filter from laterally moving.

8. The system of claim 6, wherein the L-shape edges are formed to have a thickness according to a thickness of the air filter.

9. The system of claim 1, wherein the first edge and the second edge include the one or more screws.

10. The system of claim 1, wherein each of the one more holes corresponds to each of the one or more screws.

11. The system of claim 1, wherein each of the one more magnets disposed next to each of the one or more screws corresponding to each of the one or more magnets.

12. The system of claim 1, wherein the each of the one more magnets disposed next each of the one or more holes corresponding to each of the one or more magnets.

13. A data processing system, comprising:
    a system frame to house one or more processors therein, wherein the one or more processors execute computer instructions to perform operations;
    one or more cooling fans mounted on a first side of the system frame to generate an airflow flowing outwardly to remove at least a portion of heat generated by the one or more processors; and
    an air filtering module mounted on a second side of the system frame to filter the airflow flowing inwardly to remove dust or contaminated material from the airflow, wherein the air filtering module comprises
        an air filter, wherein the air filter is separate from a cover plate,
        a mounting plate mounted onto the second side of the system frame to receive the air filter deposited thereon, wherein the mounting plate is modeled into a tray-like shape formed in an L-shape operated like a receiving well and container to receive the air filter, wherein one or more cross bars are disposed across a first edges and a second edge on the opposite side of the mounting plate, wherein the first edge and the second edge include one or more mounting holes, wherein the size of the receiving well is larger than the size of air filter, wherein a bottom cross brace of the mounting plate includes one or more mounting holes, wherein the bottom cross brace is indented from the cross bars at the bottom of the receiving well, wherein the mounting plate includes one or more magnets disposed thereon, wherein the one or more magnets comprises a first set of one or more magnets disposed on the first edge of the mounting plate and a second set of one or more magnets disposed on the second edge of the mounting plate, wherein the cover plate is made of metal to attract the one or more magnets disposed on the mounting plate to prevent the air filter from falling out, and the cover plate attached to the mounting plate by a magnetic force generated from the magnets to keep the air filter between the mounting plate and the cover plate, wherein the mounting plate is mounted onto the system frame using one or more screws.

14. The system of claim 13, wherein the cover plate is attached to the mounting plate due to the magnetic force without having to use a mounting screw to attach the cover plate onto the mounting plate.

15. The system of claim 14, wherein the cover plate is attached to the mounting plate due to the magnetic force during operations of the data processing system.

16. The system of claim 15, wherein the cover plate is detachable from the mounting plate without using a tool for a purpose of replacing the air filter.

17. The system of claim 13, wherein the mounting plate is an open frame to allow the airflow to flow through the air filter into an airspace of the system frame.

18. The system of claim 17, wherein the mounting plate comprises the one or more cross bars across opening of the open frame to prevent the air filter from falling through the open frame.

19. The system of claim 17, wherein the mounting plate comprises one or more edges molded in an L-shape to form a container.

20. The system of claim 19, wherein the L-shape edges of the mounting plate prevent the air filter from laterally moving.

* * * * *